(12) United States Patent
Mullick et al.

(10) Patent No.: US 11,131,015 B2
(45) Date of Patent: Sep. 28, 2021

(54) HIGH PRESSURE OXIDATION OF METAL FILMS

(71) Applicant: Applied Materials, Inc., Santa Clara, CA (US)

(72) Inventors: Amrita B. Mullick, Santa Clara, CA (US); Pramit Manna, Sunnyvale, CA (US); Abhijit Basu Mallick, Palo Alto, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 462 days.

(21) Appl. No.: 16/225,240

(22) Filed: Dec. 19, 2018

(65) Prior Publication Data

US 2019/0185983 A1 Jun. 20, 2019

Related U.S. Application Data

(60) Provisional application No. 62/608,484, filed on Dec. 20, 2017.

(51) Int. Cl.
| | | |
|---|---|---|
| *H01L 21/02* | (2006.01) | |
| *H01L 21/768* | (2006.01) | |
| *C23C 8/10* | (2006.01) | |
| *C23C 16/06* | (2006.01) | |
| *C23C 8/16* | (2006.01) | |
| *C23C 8/12* | (2006.01) | |
| *H01L 21/283* | (2006.01) | |
| *H01L 21/3105* | (2006.01) | |
| *H01L 21/762* | (2006.01) | |

(52) U.S. Cl.
CPC .................. *C23C 8/10* (2013.01); *C23C 8/12* (2013.01); *C23C 8/16* (2013.01); *C23C 16/06* (2013.01); *H01L 21/02244* (2013.01); *H01L 21/02614* (2013.01); *H01L 21/283* (2013.01); *H01L 21/31051* (2013.01); *H01L 21/76227* (2013.01); *H01L 21/76888* (2013.01)

(58) Field of Classification Search
CPC .......... H01L 21/02614; H01L 21/3165; H01L 21/76888; H01L 21/00244; H01L 21/283; H01L 21/31051; H01L 21/76227; C23C 8/10; C23C 16/06
USPC .................................................. 438/104, 663
See application file for complete search history.

(56) References Cited

U.S. PATENT DOCUMENTS

| | | |
|---|---|---|
| 8,906,761 B2 | 12/2014 | Kim et al. |
| 10,083,834 B2 | 9/2018 | Thompson et al. |
| 2004/0219800 A1 | 11/2004 | Tognetti |
| (Continued) | | |

FOREIGN PATENT DOCUMENTS

KR 20140135744 A 11/2014

OTHER PUBLICATIONS

International Search Report in PCT/US2018/066368, dated Apr. 29, 2019, 8 pages.

*Primary Examiner* — David Vu
*Assistant Examiner* — Brandon C Fox
(74) *Attorney, Agent, or Firm* — Servilla Whitney LLC

(57) ABSTRACT

Methods of processing thin film by oxidation at high pressure are described. The methods are generally performed at pressures greater than 2 bar. The methods can be performed at lower temperatures and have shorter exposure times than similar methods performed at lower pressures. Some methods relate to oxidizing tungsten films to form self-aligned pillars.

20 Claims, 2 Drawing Sheets

(56) References Cited

U.S. PATENT DOCUMENTS

| | | |
|---|---|---|
| 2009/0081884 A1 | 3/2009 | Yokota et al. |
| 2010/0203725 A1* | 8/2010 | Choi .................. H01L 21/76877 438/663 |
| 2013/0241037 A1* | 9/2013 | Jeong ...................... H01L 45/08 257/536 |
| 2014/0183743 A1 | 7/2014 | Matsumoto et al. |
| 2014/0239291 A1 | 8/2014 | Son et al. |
| 2017/0358483 A1 | 12/2017 | Roy et al. |
| 2018/0096847 A1* | 4/2018 | Thompson ............ H01L 21/321 |

* cited by examiner

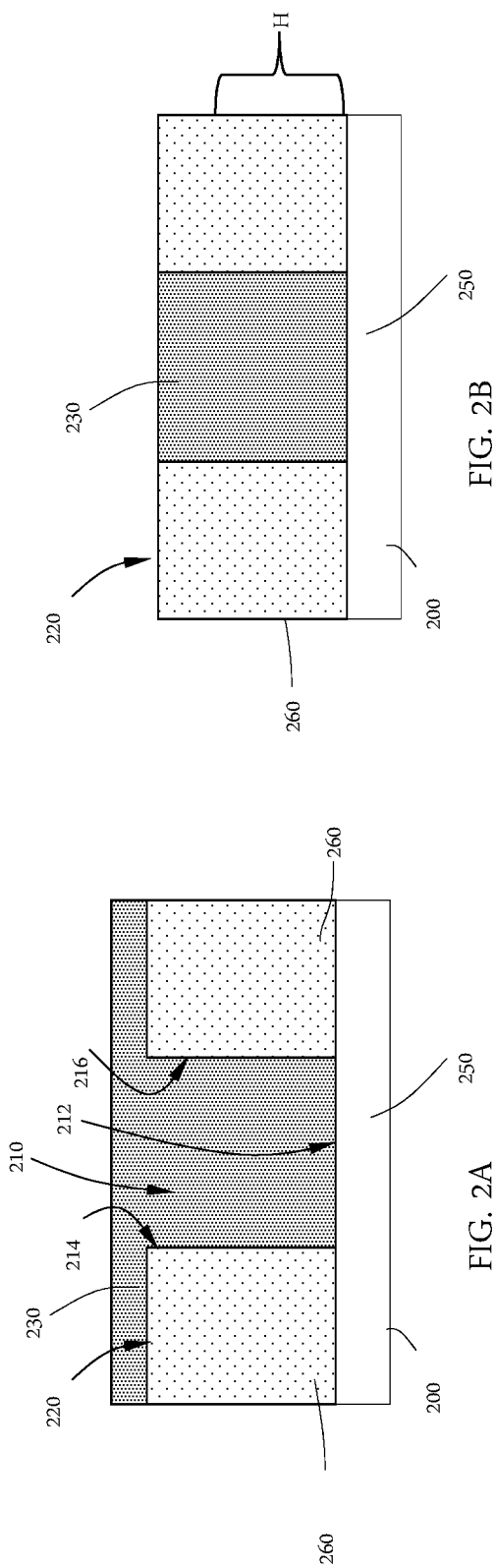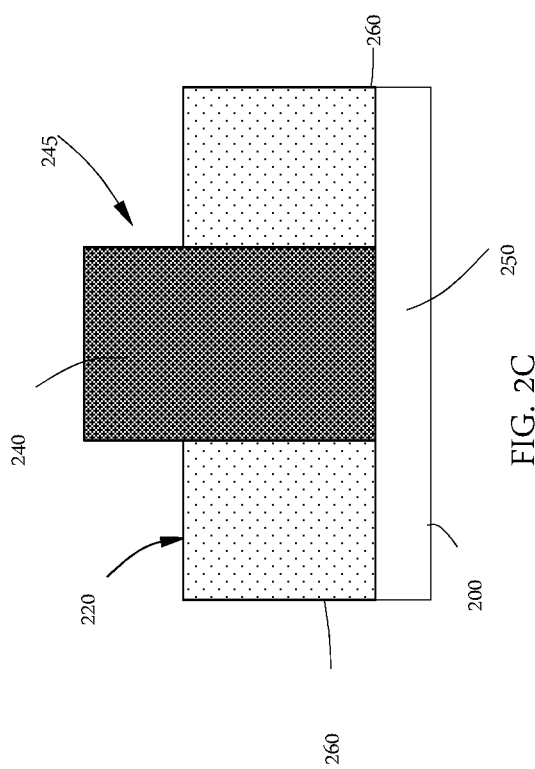
FIG. 2A
FIG. 2B
FIG. 2C

HIGH PRESSURE OXIDATION OF METAL FILMS

CROSS-REFERENCE TO RELATED APPLICATIONS

This application claims priority to U.S. Provisional Application No. 62/608,484, filed Dec. 20, 2017, the entire disclosure of which is hereby incorporated by reference herein.

TECHNICAL FIELD

The present disclosure relates generally to methods of depositing and processing thin films by oxidation at high pressures. In particular, the disclosure relates to processes for oxidizing tungsten films at pressures greater than 2 bar.

BACKGROUND

Self-aligned metal oxide pillars can be formed through the oxidation of gap-filled metal films. Metal is deposited on the structure of holes or trenches by ALD and then oxidized to form metal oxides. The volumetric expansion during oxidization pushes a pillar out of the holes or trenches. The pillars are bottom-up, selectively grown from metal only.

However, there are some challenges to using this process because of the relatively high temperatures and long exposure times needed to form the metal oxide columns. Due to the thermal budget for the device being formed, high temperatures can damage semiconductor elements which have already been formed on the substrate by previous processes. Additionally, longer exposure times decrease substrate processing throughput. The combination of these and other factors can exacerbate substrate damage leading to high device failure and therefore lower successful processing throughput rates.

Therefore, there is a need in the art for alternative methods to create self-aligned columns and structures.

SUMMARY

One or more embodiments of the disclosure are directed to a substrate processing method that comprises providing a substrate with at least one substrate surface comprising a first material comprising a metal. The first material is oxidized to form an expanded first material. The first material is oxidized by exposing the first material to an oxidizing agent at a pressure greater than or equal to about 2 bar.

Additional embodiments of the disclosure are directed to a substrate processing method. A substrate is provided with at least one substrate surface comprising a first material comprising tungsten. The first material is oxidized to expand the first material straight up from the first surface to form an expanded first material. The first material is oxidized by exposing the first material to an oxidizing agent comprising one or more of $H_2O$, $O_2$, $N_2O$, $O_3$, $CO_2$, $CO$, or $H_2O_2$, at a pressure greater than or equal to about 2 bar.

Further embodiments of the disclosure are directed to a method of substrate processing. A substrate is provided with a substrate surface with at least one feature formed therein. The at least one feature extends a distance into the substrate from the substrate surface and has a sidewall and bottom. A tungsten film is formed on the substrate surface and in the at least one feature. The tungsten film is removed from the substrate surface outside of the at least one feature. The tungsten film is oxidized to form a tungsten oxide pillar which extends from the at least one substrate feature. The tungsten film is oxidized by exposing the substrate to an oxidizing agent comprising one or more of $H_2O$, $O_2$, $N_2O$, $O_3$, $CO_2$, $CO$, or $H_2O_2$, at a pressure greater than or equal to about 2 bar.

BRIEF DESCRIPTION OF THE DRAWINGS

So that the manner in which the above recited features of the present disclosure can be understood in detail, a more particular description of the disclosure, briefly summarized herein, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIGS. 2A through 2C show a cross-sectional schematic of a self-aligned structure formation process in accordance with one or more embodiments of the disclosure.

Figure 1:
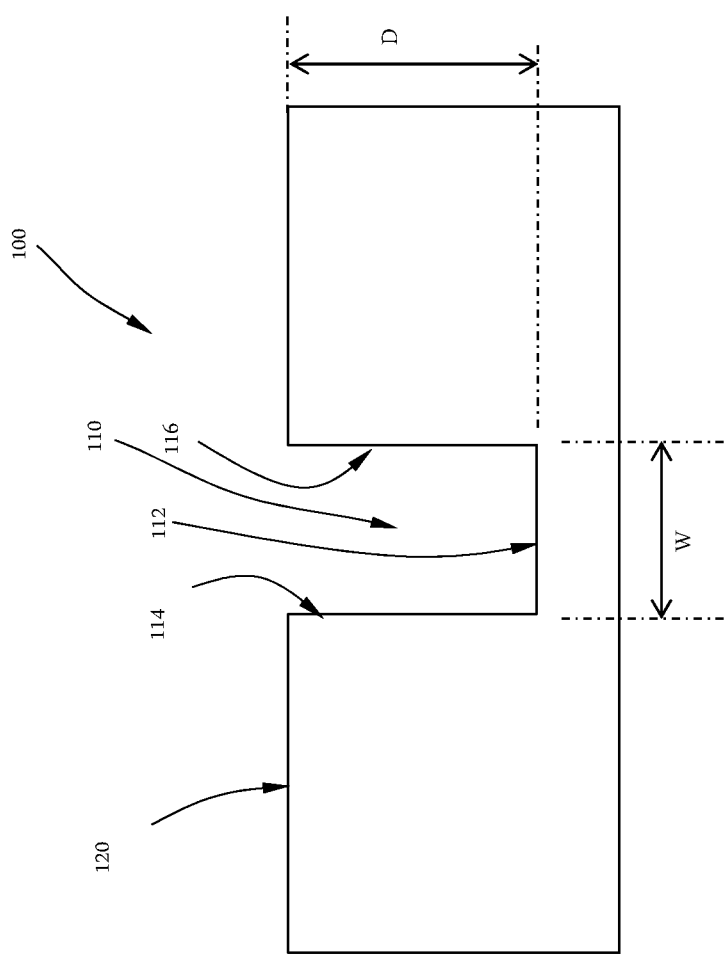
FIG. 1 shows a cross-sectional view of a substrate feature in accordance with one or more embodiments of the disclosure.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

One or more embodiments of the disclosure are directed to methods for oxidizing metal films at high pressure. Some embodiments of the disclosure advantageously provide methods of oxidizing metal films at high pressure which utilize lower temperatures. Some embodiments of the disclosure advantageously provide methods of oxidizing metal films which are able to be performed in a shorter period of time. Some embodiments of the disclosure advantageously provide methods for pillar type film growth that increase overall throughput and do not tax the thermal budget of the device.

One or more embodiments of the disclosure provide methods for substrate processing where material films (e.g. metal films) are oxidized at high pressures (e.g. greater than or equal to about 2 bar). Without being bound by theory, the higher pressures allow for lower processing temperature and faster processing times while still achieving complete oxidation of the film volume and without sacrificing the structural shape of the oxidized film.

FIG. 1 shows a partial cross-sectional view of a substrate 100 with a feature 110. The Figures show substrates having a single feature for illustrative purposes; however, those skilled in the art will understand that there can be no feature or more than one feature. The shape of the feature 110 can be any suitable shape including, but not limited to, trenches and cylindrical vias. In specific embodiments, the feature 110 is a trench. As used in this regard, the term "feature" means any intentional surface irregularity. Suitable examples of features include, but are not limited to trenches which have a top, two sidewalls and a bottom, peaks which have a top and two sidewalls extending upward from a surface and vias which have a continuous sidewall extending down from a surface with an open bottom. Features or trenches can have any suitable aspect ratio (ratio of the depth of the feature to the width of the feature). In some embodiments, the aspect ratio is greater than or equal to about 5:1, 10:1, 15:1, 20:1, 25:1, 30:1, 35:1 or 40:1.

The substrate 100 has a top surface 120. The at least one feature 110 forms an opening in the top surface 120. The feature 110 extends from the top surface 120 to a depth D to a bottom surface 112. The feature 110 has a first sidewall 114 and a second sidewall 116 that define a width W of the feature 110. The open area formed by the sidewalls and bottom are also referred to as a gap.

In some embodiments, the substrate comprises a first material which forms at least one surface. In some embodiments, the first material comprises a metal. As used in this regard, a metal is any metal or metalloid found on the periodic table of elements. In some embodiments, the metal of the first material comprises more than one metallic element. In some embodiments, the metal is selected from the group consisting of W, Ru, Ta, Ir, Co, Mo, Ti, Rh, Cu, Fe, Mn, V, Nb, Hf, Zr, Y, Al, Sn, Cr, La and combinations thereof. In some embodiments, the metal is selected from the group consisting of W, Ru, Ta, Ir and combinations thereof. In some embodiments, the metal consists essentially of tungsten. In some embodiments, the first material consists essentially of tungsten (e.g. tungsten metal). As used in this regard, "consists essentially of" means that the composition of the subject material is greater than or equal to about 95%, 98%, 99% or 99.5% of the stated material.

Oxidizing the first material creates an expanded first material. As used in this disclosure, oxidation, oxidizing and the like refer to an increase in the average oxidation state of the material being oxidized. Oxidation should not be interpreted to require that oxygen atoms are added to a material.

With reference to FIGS. 2A through 2C, an exemplary embodiment of the disclosure is illustrated. A substrate 200 is provided for processing. The substrate 200 is similar to the substrate 100 shown in FIG. 1. As used in this regard, the term "provided" means that the substrate is placed into a position or environment for further processing. The substrate 200 illustrated in FIG. 2A has a first surface material 250 and a second surface material 260. The presence of multiple surface materials is illustrative and not required. The first surface material 250 and the second surface material 260 may be the same or different surface materials on the substrate 200. In the illustrated embodiment, the feature 210 is formed with the bottom 212 being the first surface 250 and the sidewalls 214, 216 and the top surface 220 being the second surface material 260.

A film 230 is formed on the top surface 220 and the sidewalls 214, 216 and bottom 212 of the feature 210. The film 230 can be any suitable film formed by any suitable process including, but not limited to, chemical vapor deposition, plasma-enhanced chemical vapor deposition, atomic layer deposition, plasma-enhanced atomic layer deposition and/or physical vapor deposition. In some embodiments, the film 230 is formed by atomic layer deposition or plasma-enhanced atomic layer deposition. In some embodiments, the substrate is provided with the film 230 having already been formed on the substrate 200. In some embodiments, the film 230 may be referred to as a first material.

The film 230 can be any suitable material that can be oxidized. Oxidizable materials include zero valent metals and partial oxides (sub-oxides). In some embodiments, the film 230 is a metal sub-oxide film. As used herein, a sub-oxide is any metal complex where the oxidation state of the metal is greater than 0 and less than the oxidation state of the metal in its fully oxidized form (i.e. highest oxidation state). For example, tungsten oxide may exist in several forms, namely, $W_2O_3$, $WO_2$ or $WO_3$. In this case, both $W_2O_3$ and $WO_2$ would be considered sub-oxides since they correspond to oxidation states of +3 and +4 respectively and $WO_3$ has an oxidation state of +6. Those skilled in the art will recognize that sub-oxides do not need to contain oxygen. In some embodiments, suitable sub-oxides may contain one or more of oxygen, boron, nitrogen, carbon, germanium or silicon. Stated differently, in some embodiments, suitable metal sub-oxides may comprise metal oxides, metal nitrides, metal borides, metal carbides, metal germanides, metal silicides, or combinations thereof (i.e. metal oxynitrides).

Those skilled in the art will understand that the metal sub-oxide film may have a non-stoichiometric amount of atoms. For example, a film designated as WN may have different amounts of tungsten and nitrogen. The WN film may be, for example, 90 atomic % tungsten. The use of WN to describe a tungsten nitride film means that the film comprises tungsten and nitrogen atoms and should not be taken as limiting the film to a specific composition. In some embodiments, the film consists essentially of the designated atoms. For example, a film consisting essentially of WN means that the composition of the film is greater than or equal to about 95%, 98%, 99%, or 99.5% tungsten and nitrogen atoms. In some embodiments, the film 230 comprises tungsten. In one or more embodiments, the film 230 comprises titanium.

In FIG. 2B, the film 230 is removed from the top surface 220 such that it is contained entirely within the feature 210. The film 230 can be removed by any suitable process. In some embodiments, the film 230 is removed by a chemical-mechanical planarization (CMP) process.

In some embodiments, substantially all of the film 230 is formed within the feature 210. As used in this regard, the term "substantially all" means that greater than or equal to about 95%, 98% or 99% of the film is formed within the feature 210 on a weight basis.

In some embodiments, the film 230 is selectively deposited within the feature 210 and is not deposited on the top surface 220 of the substrate. In these embodiments, the substrate 200 would be processed such that it would flow from FIG. 1 to FIG. 2B without appearing like FIG. 2A. The compositions of the first surface material 250 and the second surface material 260 can be chosen to allow selective deposition of the film 230 on one surface relative to the other.

In some embodiments, the method includes selectively depositing a film 230 within the trench to a height H less than or equal to the depth of the feature 210. In one embodiment, the film 230, fills at least 10% of the volume of the trench. In other embodiments, the film 130 fills at least 15%, 20%, 25%, 30%, 35%, 40%, 45%, 50%, 55%, 60%, 65%, 70%, 75%, 80%, 85%, 90%, 95% or 100% of the volume of the trench. In some embodiments, the film 230 deposited in the feature 210 has a height H that is less than or equal to about 98%, 95%, 90%, 80%, 70%, 60% or 50% of the depth of the feature 210.

As shown in FIG. 2C, the processing method further comprises oxidizing the film 230 to expand the film material volume to provide an expanded film 240. In some embodiments, the expanded film 240 is referred to as an expanded first material. In some embodiments, the expanded film 240 extends beyond the top surface 220 of the substrate. In some embodiments, the expanded film 240 comprises a metal oxide. The expanded film 240 forms a self-aligned structure. During expansion, the fidelity of the feature shape is maintained on the top of the feature so that the film 230 grows straight up from the feature 210. As used in this regard, "straight up" means that the sides of the expanded film 240 are substantially coplanar with the sidewall 214, 216 of the feature 210. A surface is coplanar with the sidewall 214 where the angle formed at the junction of the sidewall 214 and the surface is ±10°. In this regard, an expanded film which extends "straight up" from the feature may be described as orthogonal to the top surface of the substrate if the sidewalls are perpendicular to the top surface.

The film 230 has an average metal oxidation state in the range of 0 to less than the average metal oxidation state of the expanded film 240. In some embodiments, the film 230 has a metal to oxide ratio less than or equal to about 80% of a metal to oxide ratio of the expanded film 240. In some embodiments, the expanded film 240 is substantially orthogonal to the top surface 220 of the substrate.

Suitable metals for use in metal or metal sub-oxide films include, but are not limited to, metals having a Pilling-Bedworth ratio greater than 2, greater than 2.25, or greater than 2.5. Pilling-Bedworth ratio refers to a ratio of a volume of the elementary cell of a metal oxide to the volume of the elementary cell of the corresponding metal from which the oxide is formed. The Pilling-Bedworth ratio is defined as the $V_{oxide}/V_{metal}$, where V is volume. For determining the Pilling-Bedworth ratio of a metal oxide, $V_{oxide}$ equals the molecular mass of the of the metal oxide multiplied by the density of the metal, and $V_{metal}$ equals the number of atoms of metal per one molecule of the oxide multiplied by the atomic mass of the metal multiplied by the density of the oxide. Examples of such films include one or more of Co, Mo, W, Ta, Ti, Ru, Rh, Cu, Fe, Mn, V, Nb, Hf, Zr, Y, Al, Sn, Cr, Os, U and/or La.

In some embodiments, the metal film comprises tungsten and the expanded metal film comprises $WO_3$, or a sub-oxide thereof.

In one embodiment, oxidizing the film 230 comprises exposing the film to an oxidizing agent. In some embodiments, oxidizing the film 230 comprises exposing the film to an oxidizing agent comprising one or more of $O_2$, $O_3$, $N_2O$, $H_2O$, $H_2O_2$, CO, $CO_2$, $NH_3$, $N_2$, N2/Ar, $N_2$/He, $N_2$/Ar/He, alcohols halogens and peroxy acids. In some embodiments, the oxidizing agent consists essentially of $H_2O$.

In some embodiments, oxidizing the film comprises a thermal oxidation process. As used in this regard, a thermal oxidation process does not include plasma. In some embodiments, oxidizing the film comprises a plasma oxidation process. In some embodiments, oxidizing the film comprises a remote plasma, plasma generated by microwave and/or radio-frequency (e.g., ICP, CCP).

In some embodiments, the film 230 is exposed to a siliciding agent to convert the film to a silicide film. The siliciding agent can be any suitable siliciding agent including, but not limited to, silane, disilane, trisilane, tetrasilane, pentasilane, hexasilane, trimethyl silane, compounds with trimethylsilyl substituents and combinations thereof. One skilled in the art will recognize that conversion of the film to a silicide film may also result in an expanded film.

In some embodiments, the film 230 is exposed to a germanium agent to convert the film to a germanicide film. The germaniciding agent can be any suitable germaniciding agent including, but not limited to, germane, digermane, trigermane, tetragermane, pentagermane, hexagermane, trimethyl germanium, compounds with trimethylgermanyl substituents and combinations thereof. One skilled in the art will recognize that conversion of the film to a germanicide film may also result in an expanded film.

Oxidizing the film 230 can occur at any suitable temperature depending on, for example, the composition of the film and the oxidizing agent. In some embodiments, the film expansion occurs at a temperature in the range of about 25° C. to about 1100° C.

In some embodiments, treating the film 230 occurs at a temperature less than or equal to about 450° C., or less than or equal to about 425° C., or less than or equal to about 400° C., or less than or equal to about 350° C., or less than or equal to about 300° C. or less than or equal to about 250° C. In some embodiments, the film 230 comprises tungsten and is treated at a temperature less than or equal to about 425° C.

Treating the film 230 can occur at any suitably high pressure depending on, for example, the composition of the film and the oxidizing agent. In some embodiments, the film expansion occurs at a pressure in the range of about 2 bar to about 15 bar.

In some embodiments, treating the film 230 occurs at a pressure greater than or equal to about 2 bar, or greater than or equal to about 5 bar, or greater than or equal to about 10 bar or greater than or equal to about 15 bar. In some embodiments, the film 230 comprises tungsten and is treated at a pressure greater than or equal to about 5 bar.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A substrate processing method comprising:
providing a substrate with at least one substrate surface comprising a first material comprising a metal; and
oxidizing the first material to form an expanded first material, oxidizing the first material comprises exposing the first material to an oxidizing agent at a pressure greater than or equal to about 2 bar.

2. The method of claim 1, wherein the metal is selected from the group consisting of W, Ru, Ta, Ir, Co, Mo, Ti, Rh, Cu, Fe, Mn, V, Nb, Hf, Zr, Y, Al, Sn, Cr, La and combinations thereof.

3. The method of claim 2, wherein the first material consists essentially of W.

4. The method of claim 1, wherein the oxidizing agent comprises one or more of $O_2$, $N_2O$, $H_2O$, $CO_2$, $O_3$, $H_2O_2$, CO, $NH_3$, $N_2$, alcohols, halogens and peracids.

5. The method of claim 1, wherein oxidizing the first material is performed at a temperature less than or equal to about 425° C.

6. The method of claim 5, wherein first material consists essentially of W and oxidizing the first material is performed at a pressure in a range of about 2 bar to about 15 bar.

7. A substrate processing method comprising:
providing a substrate with at least one substrate surface comprising a first material comprising tungsten; and
oxidizing the first material to expand the first material straight up from the substrate to form an expanded first material, oxidizing the first material comprises exposing the first material to an oxidizing agent comprising one or more of $H_2O$, $O_2$, $N_2O$, $O_3$, $CO_2$, CO, or $H_2O_2$, at a pressure greater than or equal to about 2 bar.

8. The method of claim 7, wherein the oxidizing agent consists essentially of $H_2O$.

9. The method of claim 7, wherein oxidizing the first material is performed at a temperature less than or equal to about 425° C.

10. The method of claim 7, wherein oxidizing the first material is performed by a thermal process without plasma.

11. The method of claim 7, wherein oxidizing the first material is performed at a pressure greater than or equal to about 10 bar.

12. The method of claim 7, wherein the expanded first material comprises $WO_3$.

13. A method of substrate processing comprising:
providing a substrate with a substrate surface with at least one feature formed therein, the at least one feature extending a distance into the substrate from the substrate surface and having a sidewall and bottom;
forming a tungsten-containing film on the substrate surface and in the at least one feature;
removing the tungsten-containing film from the substrate surface outside of the at least one feature; and
oxidizing the tungsten-containing film to form a tungsten oxide pillar which extends from the at least one feature, oxidizing the tungsten-containing film comprises exposing the substrate to an oxidizing agent comprising one or more of $H_2O$, $O_2$, $N_2O$, $O_3$, $CO_2$, CO, or $H_2O_2$, at a pressure greater than or equal to about 2 bar.

14. The method of claim 13, wherein the tungsten-containing film consists essentially of tungsten.

15. The method of claim 13, wherein the tungsten-containing film comprises a tungsten sub-oxide having an average tungsten oxidation state in a range of greater than 0 to less than +6.

16. The method of claim 13, wherein removing the tungsten-containing film from the substrate is performed by chemical-mechanical planarization.

17. The method of claim 13, wherein the tungsten-containing film is removed so that a top of the tungsten-containing film is about coplanar with the substrate surface outside the feature.

18. The method of claim 13, wherein the oxidizing agent consists essentially of $H_2O$.

19. The method of claim 13, wherein the tungsten oxide pillar comprises $WO_3$.

20. The method of claim 13, wherein the tungsten oxide pillar comprises a tungsten sub-oxide having an average tungsten oxidation state in a range of greater than 0 to less than +6.

* * * * *

UNITED STATES PATENT AND TRADEMARK OFFICE
CERTIFICATE OF CORRECTION

PATENT NO. : 11,131,015 B2
APPLICATION NO. : 16/225240
DATED : September 28, 2021
INVENTOR(S) : Amrita B. Mullick et al.

It is certified that error appears in the above-identified patent and that said Letters Patent is hereby corrected as shown below:

In the Claims

Column 7, Line 28, replace "$0_3$" after "$CO_2$," and before "$H_2O_2$," with "$O_3$".

Signed and Sealed this
Ninth Day of November, 2021

Drew Hirshfeld
*Performing the Functions and Duties of the*
*Under Secretary of Commerce for Intellectual Property and*
*Director of the United States Patent and Trademark Office*